US007525643B2

(12) United States Patent
Butler

(10) Patent No.: US 7,525,643 B2
(45) Date of Patent: Apr. 28, 2009

(54) LITHOGRAPHIC APPARATUS, AND MECHANISM

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 540 days.

(21) Appl. No.: 11/228,464

(22) Filed: Sep. 19, 2005

(65) Prior Publication Data

US 2007/0062398 A1     Mar. 22, 2007

(51) Int. Cl.
*G03B 27/58* (2006.01)
*G03B 27/62* (2006.01)
*H01H 47/00* (2006.01)

(52) U.S. Cl. .............................. 355/72; 355/75; 361/144

(58) Field of Classification Search .................... 355/72, 355/75; 361/139, 144; 123/90.11
See application file for complete search history.

(56) References Cited

U.S. PATENT DOCUMENTS 6,334,413 B1 * 1/2002 Hattori et al. ............ 123/90.11

6,768,626 B1 * 7/2004 Hemmer ..................... 361/139

FOREIGN PATENT DOCUMENTS

EP      1 124 244 A2    8/2001
JP      2001297912 A  * 10/2001

OTHER PUBLICATIONS

Koshiyama et al. (JP 2001297912 A) English translation of the abstract. Oct. 2001.*

* cited by examiner

*Primary Examiner*—Peter B Kim
(74) *Attorney, Agent, or Firm*—Sterne, Kessler, Goldstein & Fox P.L.L.C.

(57) ABSTRACT

A lithographic apparatus has a mechanism with a movable element, at least partially made from a magnetizable material. The movable element is movable between a first position and a second position. A pretensioner exerts a pretension force on the movable element urging it to the first position. A permanent magnet produces a magnetic field exerting a force on the movable element urging it to the second position. A coil produces, when energized in a first direction, a magnetic field exerting a force on the movable element urging it to the second position. The combined magnetic field of the magnet and the coil exerts a force on the movable element which is higher than the pretension force.

13 Claims, 3 Drawing Sheets

LITHOGRAPHIC APPARATUS, AND MECHANISM

BACKGROUND

1. Field of the Invention

The present invention relates to a lithographic apparatus, and a mechanism.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the operation of a lithographic apparatus, different objects to be used or processed are taken from one location to another in the apparatus, while such objects previously have been placed or stored in the apparatus. In the placement or storage of an object, care must be taken that the object is held in a predetermined location and/or spatial orientation such that a handler may contact the object without human intervention, hold it, take it to another location, and place it at the other location in a predetermined way and/or spatial orientation. Before, during or after taking an object from one location to another, a fixing of the object may be required to prevent the object from an inadvertent displacement.

As an example, in a known lens or system of lenses of a lithographic apparatus, different thin, generally ring-shaped blades (also termed: cleanup aperture blades) may be used defining different openings for light passing through the lens or system of lenses. Such blades are stored in a cassette containing several blades having different openings. A specific blade for obtaining a specific opening may be taken from the cassette by connecting a gripper of a handler to the blade, the handler removing the gripped blade from the cassette, transporting the blade to the lens or system of lenses, and placing it there.

The blades are fixed in adjacent compartments of the cassette by providing the blades with hooks, and hanging the blades with the hooks engaging in holes provided in storage compartments of the cassette, or by hanging the blades on hooks provided in the storage compartments of the cassette, where the hooks engaging in holes provided in the blades.

While taking a blade from the cassette for a placement of the blade in the lens or system of lenses, or storing a blade in the cassette, the other blades need to maintain their position in the cassette, which is guaranteed by the hook and hole fixing of the blades. Thus, any change of cassette position will not lead to a change of the position of the blades remaining in the cassette.

It is, however, a cumbersome operation to remove a blade from, or to insert a blade into the cassette. Taking a blade from a hook in a cassette compartment by a handler, or placing a blade on a hook in a cassette compartment by a handler, may require complex movements of the cassette and/or the handler, which is time-consuming, the more so since the movements cannot be performed with high speed or high acceleration to prevent the blades held on the hooks in the cassette to displace relative to the hooks.

A similar situation exists in the storage, or temporary storage, and holding or fixing of other elements in a lithographic apparatus, for example diffractive optical elements, wafers, substrates, etc.

SUMMARY

A need exists for a temporary holding or fixing of objects in a lithographic apparatus, which fixing can be activated and deactivated simply and quickly.

According to an embodiment of the invention, there is provided a lithographic apparatus arranged to transfer a pattern from a patterning device onto a substrate, the lithographic apparatus having a mechanism comprising: a movable element, at least partially made from a magnetizable material, the movable element being movable between a first position and a second position; a pretensioner exerting a pretension force on the movable element urging it to the first position; a magnet producing a magnetic field exerting a force on the movable element urging it to the second position; and a coil producing, when energized in a first direction, a magnetic field exerting a force on the movable element urging it to the second position, wherein the combined magnetic field of the magnet and the coil exerts a force on the movable element which is higher than the pretension force. In an embodiment, at least in the second position of the movable element, the sum of the pretension force and a force exerted by a magnetic field produced by the coil, when energized in a second direction opposite to the first direction, is higher than the force exerted by the magnet.

Thus, the movable element may be taken from the first position to the second position by energizing the coil in the first direction, and the movable element is held in the second position by the magnet after de-energizing the coil. On the other hand, the movable element may be taken from the second position to the first position by energizing the coil in the second direction, and the movable element is held in the first position by the pretensioner after de-energizing the coil.

In another embodiment of the invention, there is provided a holding mechanism comprising: a movable element, at least partially made from a magnetizable material, the movable element being movable between a first position and a second position to engage and disengage an object; a pretensioner exerting a pretension force on the movable element urging it to the first position; a magnet producing a magnetic field exerting a force on the movable element urging it to the second position; and a coil producing, when energized in a first direction, a magnetic field exerting a force on the movable element urging it to the second position, wherein the combined magnetic field of the magnet and the coil exerts a force on the movable element which is higher than the pretension force.

According to a further embodiment of the invention, there is provided a cassette having a holding mechanism for blades to be stored in the cassette, the holding mechanism comprising: a movable element, at least partially made from a magnetizable material, the movable element being movable between a first position and a second position to engage and disengage a blade; a pretensioner exerting a pretension force on the movable element urging it to the first position; a magnet producing a magnetic field exerting a force on the movable element urging it to the second position; and a coil producing, when energized in a first direction, a magnetic field exerting a force on the movable element urging it to the second position, wherein the combined magnetic field of the magnet and the coil exerts a force on the movable element which is higher than the pretension force.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
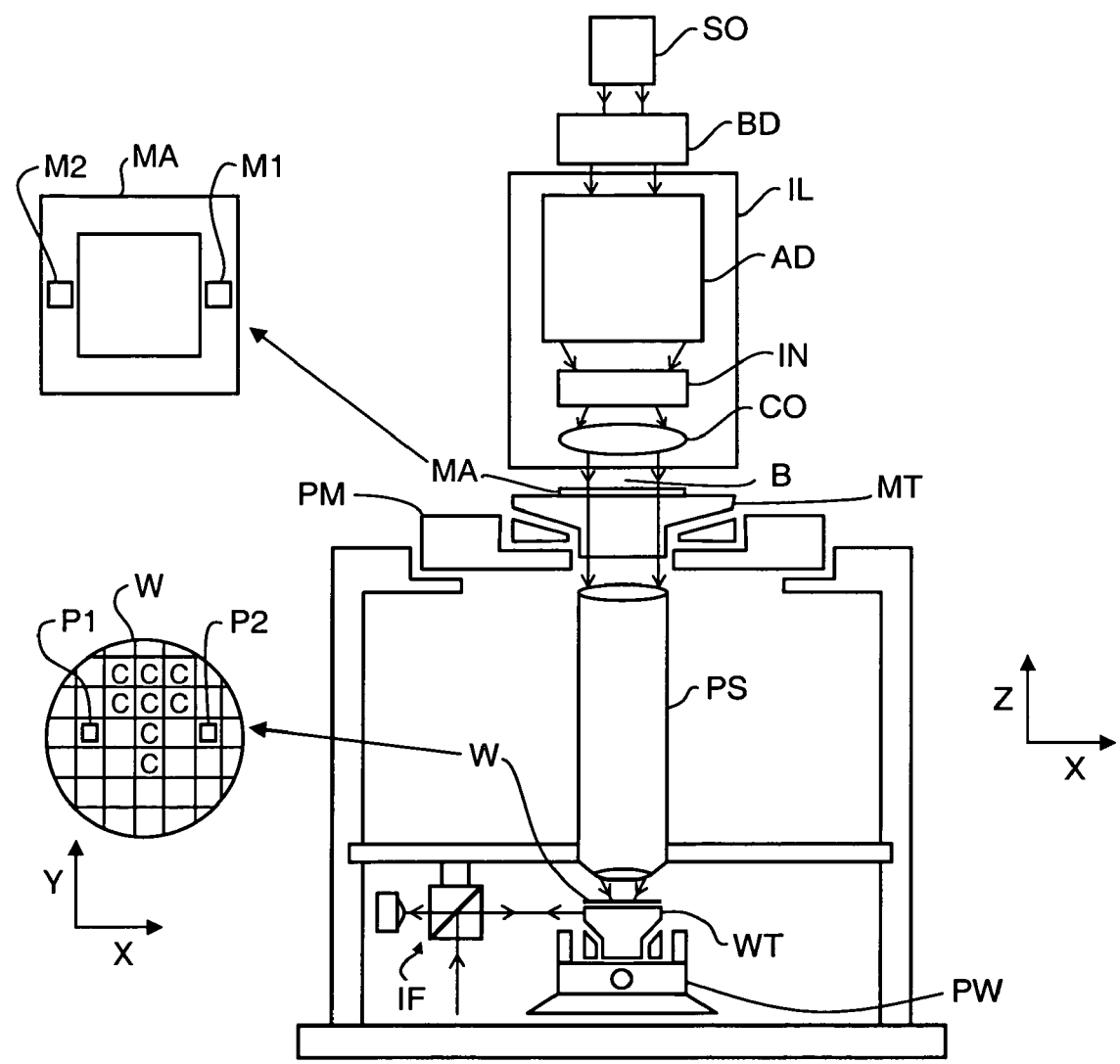
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. The illuminator further includes a cassette containing a plurality of essentially ring-shaped blades as further elucidated below.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
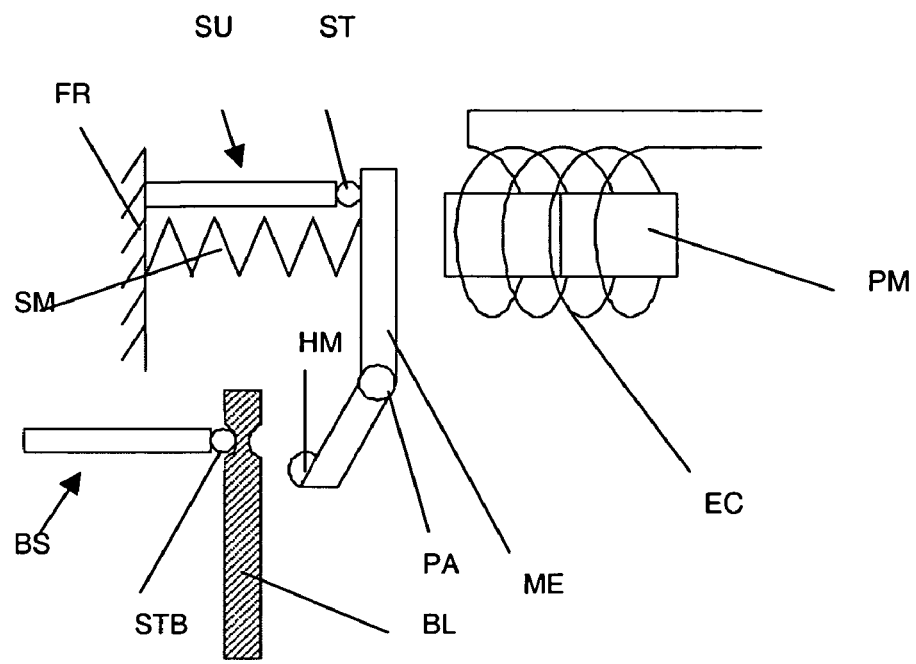
FIG. 2 schematically depicts a holding mechanism according to an embodiment of the invention in an operating mode.

FIG. 2 shows a frame part FR with a support SU connected to it. At its free end, the support SU is provided with a stop member ST. The stop member may be stiff, or may be made from a resilient material. A pivot axis PA, which is stationary relative to the frame part FR, mounts a movable element ME being pivotable around the pivot axis PA to assume different angular positions. The movable element is provided with a holding member HM, and is made at least partly from a magnetizable material. A spring member SM is connected between the movable element ME (spaced from the pivot axis PA) and the frame part FR. A blade support BS which is provided with a stop member STB, is stationary relative to the frame part FR, or may be movable relative thereto to reach a position shown in FIG. 2. The stop member STB may be stiff, or may be made from a resilient material. A permanent magnet PM is stationary relative to the frame part FR. An electromagnetic coil EC is arranged at least partly around the permanent magnet PM. FIG. 2 further shows a blade BL being provided with recesses on two opposite sides, the stop member STB engaging one of the recesses of the blade BL.

The spring member SM exerts a spring force on the movable element ME in the direction of the support SU, with the result that the movable element ME abuts the stop member ST as shown in FIG. 2. The spring member (which may be a member made from a resilient material, or a gas spring, or any other structure having similar properties) may also, in a more general way, be regarded as a pretensioner, and the spring force may also, in a more general way, be regarded as a pretension force. The permanent magnet PM produces a magnetic field exerting a magnetic force on the movable element ME in the direction of the permanent magnet PM. For this purpose, the movable element ME contains a magnetizable material in a region thereof which may be magnetized by the permanent magnet, such as a region in a part of the movable element ME facing the permanent magnet PM. In the position shown in FIG. 2, the spring force exerted by the spring member SM is higher than the magnetic force exerted by the permanent magnet PM.

Figure 3:
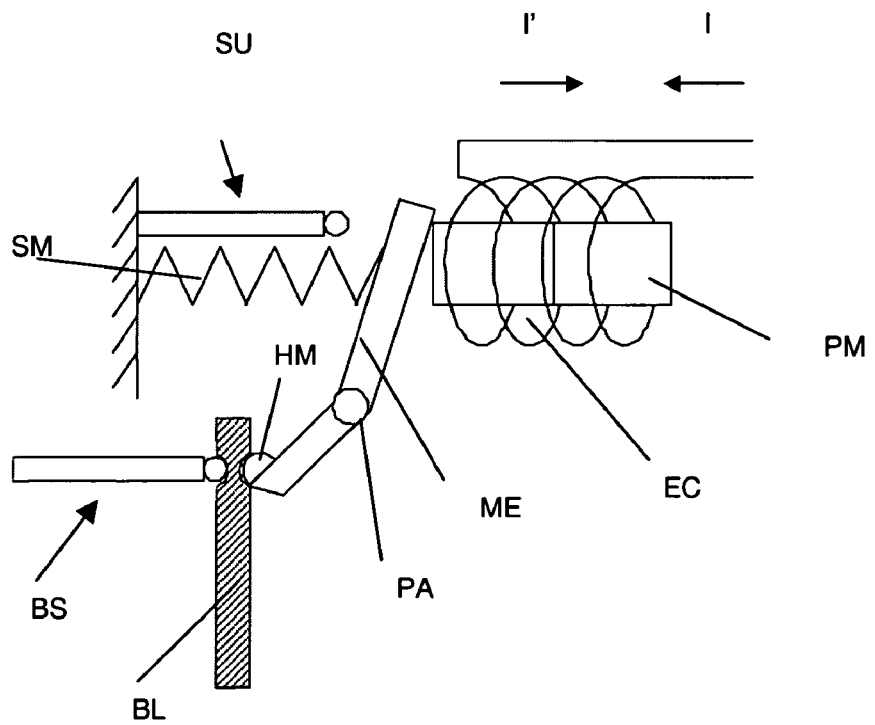
FIG. 3 schematically depicts the holding mechanism of FIG. 2 in a different operating mode.

As illustrated in FIG. 3, when a direct current I flows in the electromagnetic coil EC, the electromagnetic coil EC generates a magnetic field having the same direction as the magnetic field produced by the permanent magnet PM. The combined magnetic field of the permanent magnet PM and the electromagnetic coil EC exerts a force on the movable element ME, with the result that the movable element ME pivots to the position shown in FIG. 3, the movable element ME abutting the permanent magnet PM. The force resulting from the combined magnetic field of the permanent magnet PM and the electromagnetic coil EC is higher than the spring force exerted by the spring member SM, both in the position of the movable element ME shown in FIG. 2 and in the position of the movable element ME shown in FIG. 3, and in any position in-between. In the position shown in FIG. 3, the force exerted by the magnetic field produced by the permanent magnet PM on the movable element ME is higher than the force exerted by the spring member SM on the movable element ME, with the result that after taking away the current I in the electromagnetic coil EC, the position of the movable element ME shown in FIG. 3 is retained. In this position, the holding member HM engages a recess in the blade BL, thereby holding or fixing the blade BL effectively.

Starting from the position of the movable element ME shown in FIG. 3, a direct current I' (in opposite direction to the direction of current I) will produce a field opposite to the magnetic field of the permanent magnet PM, resulting in a combined field which is lower than that of the permanent magnet PM alone. With a suitable current I', the combined magnetic field generated by the permanent magnet PM and the coil EC may be made low enough to have a resultant force lower than the spring force exerted by the spring member SM, with the result that the movable element ME will pivot to the position shown in FIG. 2, the holding member HM disengaging the blade BL. After taking away the current I' in the electromagnetic coil EC, the position of the movable element ME shown in FIG. 2 is retained.

From the above it is clear that no energy is needed to stably keep the movable element ME in either of the positions shown in FIGS. 2 and 3, respectively. Only for a transition from the position of FIG. 2 to the position of FIG. 3, or vice versa, the electromagnetic coil should be temporarily energized with a suitable current I or I'. The higher the current I, the higher the force exerted on the movable element ME, and the quicker a transition of the position of the movable element ME shown in FIG. 2 to the position of the movable element ME shown in FIG. 3 is made. The same goes for the current I', although an upper limit should not be exceeded taking into account the magnetization and magnetic properties of the permanent magnet PM.

It will be clear that a blade BL or any other object may be fixed by using a stationary support, such as blade support BS, and a movable element, both engaging on different sides of the object. Between the support and the movable element, a clamping force may or may not be exerted, depending on the design parameters of the mechanism and the dimensions of the object to be fixed. One or more recesses may or may not be provided for the fixing. Also more than one movable element may be used to fix one object.

Figure 4A:
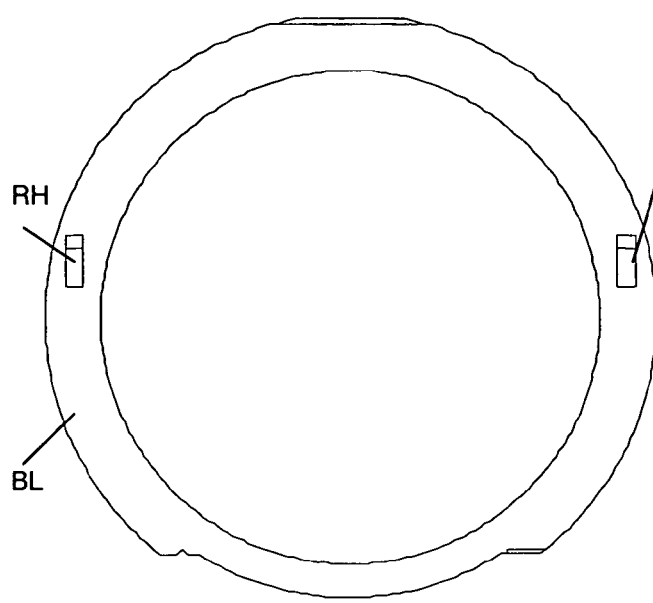
FIG. 4A shows a front view of a blade for use in a lithographic apparatus.
Figure 4B:
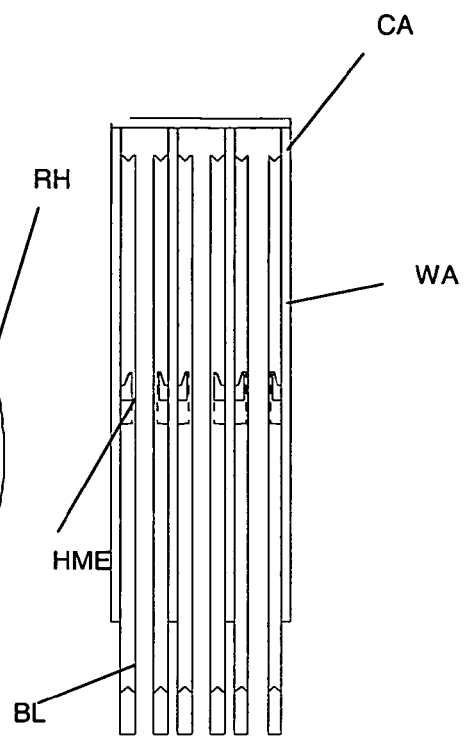
FIG. 4B shows a side view of six blades according to FIG. 4A fixed in a cassette.

FIG. 4A shows a blade BL having recesses or holes RH. Although in the embodiment of FIG. 4A two recesses or holes RH are shown, also one or more than two recesses or holes are possible. FIG. 4B shows a cassette CA having compartments or sections defined by walls WA. Each blade BL is held to an adjacent wall WA by one or more appropriately designed holding mechanisms HME as illustrated in FIGS. 2 and 3.

Instead of a blade, a holding mechanism may also hold another object in a lithographic apparatus, such as a wafer or a substrate. The object or a part thereof may (e.g., by way of a recess, hole, ridge, etc.) or may not be specifically adapted to the holding mechanism, depending on the desired holding configuration. A holding by friction is also possible.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

As required, detailed embodiments of the present invention are disclosed herein; however, it is to be understood that the disclosed embodiments are merely exemplary of the invention, which can be embodied in various forms, and may be practiced otherwise than as described. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention. Thus, it will be apparent to one skilled in the art that modifications may be made to the invention as described without departing from the scope of the claims set out below.

The terms "a" or "an," as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A lithographic apparatus arranged to transfer a pattern from a patterning device onto a substrate, the lithographic apparatus including a mechanism comprising:

a movable element, at least partially made from a magnetizable material, the movable element being movable between a first position and a second position;

a pretensioner exerting a pretension force on the movable element urging it to the first position;

a magnet producing a magnetic field exerting a force on the movable element urging it to the second position; and a coil producing, when energized in a first direction, a magnetic field exerting a force on the movable element urging it to the second position, wherein the combined magnetic field of the magnet and the coil exerts a force on the movable element which is higher than the pretension force, and wherein the movable element is rotatable around an axis, said first position being first angular position, and said second position being a second angular position.

2. The lithographic apparatus of claim 1, wherein, at least in the first position of the movable element, the pretension force is higher than the force exerted by the magnet.

3. The lithographic apparatus of claim 1, wherein, at least in the second position of the movable element, the force exerted by the magnet is higher than the pretension force.

4. The lithographic apparatus of claim 1, wherein, at least in the second position of the movable element, the sum of the pretension force and a force exerted by a magnetic field produced by the coil, when energized in a second direction opposite to the first direction, is higher than the force exerted by the magnet.

5. The lithographic apparatus of claim 1, wherein the pretensioner is a spring member.

6. The lithographic apparatus of claim 1, wherein the magnet is a permanent magnet.

7. The lithographic apparatus of claim 1, wherein the magnet is mounted at least partially in the coil.

8. The lithographic apparatus of claim 1, wherein the mechanism is a holding mechanism.

9. The lithographic apparatus of claim 8, wherein the movable element comprises a holding member adapted to engage and disengage an object.

10. The lithographic apparatus of claim 9, wherein the object is a blade.

11. The lithographic apparatus of claim 1, further comprising:

a patterning device support configured to hold a patterning device, the patterning device configured to pattern a radiation beam to provide a patterned beam of radiation;

a substrate table configured to hold a substrate; and a projection system configured to project the patterned beam of radiation onto the substrate.

12. A holding mechanism comprising:

a movable element, at least partially made from a magnetizable material, the movable element being movable between a first position and a second position to engage and disengage an object;

a pretensioner exerting a pretension force on the movable element urging it to the first position;

a magnet producing a magnetic field exerting a force on the movable element urging it to the second position; and a coil producing, when energized in a first direction, a magnetic field exerting a force on the movable element urging it to the second position, wherein the combined magnetic field of the magnet and the coil exerts a force on the movable element which is higher than the pretension force, and wherein the movable element is rotatable around an axis, said first position being a first angular position, and said second position being a second angular position.

13. A cassette including a holding mechanism for blades to be stored in the cassette, the holding mechanism comprising:

a movable element, at least partially made from a magnetizable material, the movable element being movable between a first position and a second position to engage and disengage a blade;

a pretensioner exerting a pretension force on the movable element urging it to the first position;

a magnet producing a magnetic field exerting a force on the movable element urging it to the second position; and a coil producing, when energized in a first direction, a magnetic field exerting a force on the movable element urging it to the second position, wherein the combined magnetic field of the magnet and the coil exerts a force on the movable element which is higher than the pretension force, and wherein the movable element is rotatable around an axis, said first position being a first angular position, and said second position being a second angular position.

* * * * *